(12) United States Patent
Ganai et al.

(10) Patent No.: US 7,305,637 B2
(45) Date of Patent: Dec. 4, 2007

(54) EFFICIENT SAT-BASED UNBOUNDED SYMBOLIC MODEL CHECKING

(75) Inventors: Malay K. Ganai, Plainsboro, NJ (US); Aarti Gupta, Princeton, NJ (US); Pranav Ashar, Belle Mead, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 265 days.

(21) Appl. No.: 11/087,898

(22) Filed: Mar. 23, 2005

(65) Prior Publication Data

US 2005/0240885 A1 Oct. 27, 2005

Related U.S. Application Data

(60) Provisional application No. 60/564,174, filed on Apr. 21, 2004.

(51) Int. Cl.
*G06F 17/50* (2006.01)
(52) U.S. Cl. ............................... 716/4; 716/3
(58) Field of Classification Search ............... 716/3–6
See application file for complete search history.

(56) References Cited

U.S. PATENT DOCUMENTS 6,473,884 B1 * 10/2002 Ganai et al. .................. 716/3
2002/0178424 A1 * 11/2002 Gupta et al. .................. 716/5
2004/0093572 A1 * 5/2004 Jain et al. ..................... 716/5
2004/0103378 A1 * 5/2004 Jain ............................. 716/3
2004/0123254 A1 * 6/2004 Geist et al. ................... 716/4
2004/0153983 A1 * 8/2004 McMillan ..................... 716/5
2004/0210860 A1 * 10/2004 Ganai et al. .................. 716/5
2004/0230407 A1 * 11/2004 Gupta et al. .................. 703/2
2005/0155002 A1 * 7/2005 Lai et al. ...................... 716/3
2005/0171747 A1 * 8/2005 Franco et al. ................ 703/2
2005/0192789 A1 * 9/2005 Yang ........................... 703/22
2005/0216871 A1 * 9/2005 Prasad et al. ................ 716/4

OTHER PUBLICATIONS

Sheng, S. Et al., Efficient preimage computation using a novel success-driven ATPG. Dec. 2003, IEEE pp. 1-8.*
McMillan Applying SAT methods in unbounded symbolic model checking, IEEE Proc., CAV, 2002, pp. 1-14.*
Seshia, Sanjit A., et al., "Unbounded, fully symbolic model checking of timed automata using boolean methods", IEEE Proc CAV, 2003. pp. 1-13.*

* cited by examiner

*Primary Examiner*—Stacy Whitmore
(74) *Attorney, Agent, or Firm*—Brosemer, Kolefas & Associates

(57) ABSTRACT

An efficient approach for SAT-based quantifier elimination and pre-image computation using unrolled designs that significantly improves the performance of pre-image and fix-point computation in SAT-based unbounded symbolic model checking.

28 Claims, 12 Drawing Sheets

```
1.    mSAT-EQ(f,A,B) { // calculate ∃ B f(A,B)
2.       C=∅; //initialize constraint
3.       while (SAT_Solve(f=1∧C=0)=SAT) {
4.          α=get_assignment_cube();
5.          m=get_satisfying_input_minterm(α,B);
6.          fₘ=cofactor_cube(f,m);
7.          C=C∨ fₘ;
8.       }else return C; } // return when no more solution
```

Our SAT-based existential quantification

1. SAT_Solve(P=1) { //Check if (P=1) satisfiable?
2. while(*Decide*()=SUCCESS) //Selects a new variable
3. while(*Deduce*()=CONFLICT)//BCP till conflict
4. if (*Diagnose*()=FAILURE)//conflict-driven learning
5. return UNSAT;//Conflict found at decision level 0
6. return SAT;} //No more decision to make

FIGURE 2

Prior Art DPLL style SAT Solver

1. SAT-EQ(f,A,B) { // calculate ∃ B f(A,B)
2. C=∅; //initialize constraint
3. while (SAT_Solve(f=1∧C=0)=SAT) {
4. α=get_assignment_cube();
5. c=get_enumerated_cube(α,A); //obtain, ∃B α
6. C=C∨c;
7. }else return C; } // return when no more solution

FIGURE 3

SAT-based Existential Quantification

1. Fix_point_EF(f) { // compute least fixed point for EF(f(X))
2. R(X)=∅; T(X)=f(X); //initialize
3. while(T(X) !=0) {// fixed-point reached?
4. R(X) = R(X)∨ T(X); //update R
5. //Compute pre-image states for T but not in R
6. T(X)=SAT-EQ(δ ∧T(<X←Y>)∧¬R(X), X, U∪Y); }
7. return R(X); // returns states satisfying EF(f(X))

FIGURE 4

Fix-point computation for EF(f)

```
//k=bound, s=initial states, P=safety property, I=Invariant
iBMC(k,P,s,I) {
  for (int i=0; i<=k ; i++) {
    P^i=Unroll(P,i); //property node at i^th unrolled frame
    IC = C ∧ ¬P^i ∧ I ∧ loopFreePath;
    if (SAT_Solve(IC=1)=UNSAT) return PROOF;
    BC = C ∧ ¬P^i ∧ s;
    if (SAT_Solve(BC=1)=SAT) return CE;
    C=C ∧ \vec{P^i} ; }
  return UNDETERMINED; } //Bound reached
```

SAT-based BMC with Induction proof

```
//α=satisfying assignment, F=list of frontier, n=node
1.   Get_More_Frontiers(n,α,F) {
2.      if (is_visited(n)) return;
3.      mark_visited(n);
4.      l = left_child(n); r = right_child(n);
5.      if (α(n)=0) {
6.         Get_More_Frontiers(l,α,F);
7.         Get_More_Frontiers(r,α,F);
8.      }else {
9.         if (α (l)=1) {
10.           if (heuristic2 || heuristic3)
11.              if (r ∉ dom(α))  F=F∪{r};
12.           if (heuristic4 || heuristic5)
13.              if (!is_latch_frontier(r) && r∉dom(α)) F=F∪{r};
14.           Get_More_Frontiers(l,α,F);
15.        }
16.        if (α (r)=1) {
17.           if (heuristic2 || heuristic3)
18.              if (l ∉ dom(α))  F=F∪{l};
19.           if (heuristic4 || heuristic5)
20.              if (!Is_latch_frontier(l) && l∉dom(α)) F= F∪{l};
21.           Get_More_Frontiers(r,α,F);
22.        }
23.   }
```

FIGURE 6

SAT-based BMC with Induction proof

```
1. mSAT-EQ(f,A,B) { // calculate ∃ B f(A,B)
2. C=∅; //initialize constraint
3. while (SAT_Solve(f=1∧C=0)=SAT) {
4.   α=get_assignment_cube();
5.   m=get_satisfying_input_minterm(α,B);
6.   f_m=cofactor_cube(f,m);
7.   C=C∨ f_m;
8. }else return C; } // return when no more solution
```

FIGURE 7

Our SAT-based existential quantification 1. mFix_Point_EF(f) { // compute fixed point for EF(f(X))
2. i=0; R(X)=∅; $f^0$(X)=f(X); //initialize
3. while(T(X) !=0) {// fixed-point reached?
4. R(X)=R(X)∨T(X); //add $i^{th}$ pre-image of f
5. i = i+1; //increase the pre-image depth
6. $f^i$(X,U) = Unroll(f,i);
7. //Compute states for $f^i$ but not in R
8. T(X)=mSAT-EQ($f^i$ ∧¬R(X), X, U); }
9. return R(X); // returns states satisfying EF(f(X))

FIGURE 8

Modified Fix-Point Computation for EF

EFFICIENT SAT-BASED UNBOUNDED SYMBOLIC MODEL CHECKING

CROSS REFERENCE TO RELATED APPLICATIONS

This application claims the benefit of U.S. Provisional Application No. 60/564,174 filed on Apr. 21, 2004, the contents of which are incorporated herein by reference. In addition, this application is related to U.S. utility patent application Ser. No. 10/157,486, entitled "EFFICIENT APPROACHES FOR BOUNDED MODEL CHECKING," filed on May 30, 2002, the contents of which are incorporated by reference.

FIELD OF THE INVENTION

The present invention relates generally to techniques for the formal analysis, verification and modeling of digital circuits.

BACKGROUND OF THE INVENTION

Model checking is an automatic technique for the verification of concurrent systems. It has several advantages over simulation, testing, and deductive reasoning, and has been used successfully in practice to verify complex sequential circuit designs and communication protocols. (See, for example, E. M. Clarke, O. Grumberg, and D. A. Peled, "Model Checking," MIT Press, 2000; and K. L. McMillian, "Symbolic Model Checking: An Approach to the State Explosion Problem," Kluwer Academic Publishers, 1993.)

In addition, satisfiability-based (SAT-based) bounded model checking (BMC) has been shown to be demonstrably more robust and scalable compared to methods based on binary decision diagrams (BDDs). And in sharp contrast to BDD-based methods, BMC focuses on finding bugs of bounded length—successively increasing the bound to search for longer traces.

As such, when given a design and a correctness property, BMC generates a Boolean formula by unrolling the design for k transitions such that the formula is satisfiable if and only if there is a counter-example of length k. And while BMC can find bugs in larger designs than BDD-based methods, the correctness of the property is guaranteed only for the analysis bound unless some completeness threshold is reached. (See, for example, A. Biere, A. Cimatti, E. M. Clarke, M. Fujita, and Y. Zhu, "Symbolic model checking using SAT procedures instead of BDDs," in Proceedings of the 36th ACM/IEEE Design Automation Conference, pages 317-20, 1999; and M. Sheeran, S. Singh, and G. Stalmarck, "Checking safety properties using induction and a SAT solver," in Conference on Formal Methods in Computer-Aided Design, Vol. 1954 of Lecture Notes in Computer Science, pages 108-25, Springer, November 2000.)

The use of SAT-based quantifier elimination through a series of SAT calls has been the focus of Symbolic Model Checking algorithm(s) (a.k.a. Unbounded Model Checking (UMC)) proposed in the prior art. See A. Gupta, Z. Yang, P. Ashar, "SAT-based Image Computation with Applications in Reachability Analysis," in Proceedings of Conference on Formal Methods in Computer-Aided Design, pp. 354-71 (2000); H. J. Kang and I. C. Park, "SAT-based Unbounded Symbolic Model Checking," in Design Automation Conference, pp. 840-43 (2003); K. McMillan, "Applying SAT Methods in Unbounded Symbolic Model Checking," in Computer-Aided Verification, pp. 250-64 (2002). In these approaches, the transition relation is represented in conjunctive normal form (CNF) and a SAT procedure is used to enumerate all state cube solutions. Similar to traditional model checking, the number of pre-image computations required is bounded by the diameter of the state space, and the method provides a guarantee of correctness when the safety property is true.

In one approach in the prior art, a blocking clause representing the negation of the enumerated state cube is added at each step. In another approach, a redrawing of the implication graph is carried out to enlarge the state cube. Additionally, a two-level minimizer has been used to compact the increase in CNF size due to the addition of new blocking clauses.

Note that in both approaches, only a single state cube is captured at any enumeration step. Since the number of required enumerations is bounded below by the size of a two-level prime and irredundant cover of the entire state set, quantifier elimination based on cube-by-cube enumeration tends to be expensive.

In a slightly different approach in the prior art, SAT-based quantifier elimination is achieved using a PODEM-based ATPG solver. (See, for example S. Sheng and M. Hsiao, "Efficient Pre-image Computation Using a Novel Success-Driven ATPG," in Design Automation and Test in Europe (2003).) The approach described therein uses a satisfying cutset to prune the search space for new solutions and a BDD representation for the enumerated solutions. And while this approach does reduce the umber of backtracks due to efficient pruning, it still has to enumerate all state cubes and is prone to the BDD explosion problem.

In yet another approach, ATPG is used as the search engine, and state cube enlargement is achieved using a separate justification procedure once a satisfying SAT result is found. (See, for example, M. K. Iyer, G. Parthasarathy, and K. T. Cheng, "SATORI: An Efficient Sequential SAT Solver for Circuits," in International Conference on Computer-Aided Design (2003).) Unfortunately, however, this approach is also limited by its cube-wise enumeration strategy.

In yet another approach, the transition relation is expressed in CNF while the enumerated states are represented as one or more BDDs. (See A. Gupta et al., cited above.) With this approach, the image computation is performed by invoking BDD-based quantification on the CNF formula at intermediate points in the SAT decision tree. Bounding against the already enumerated BDDs provides additional pruning of the SAT search as well as a means to detect the fix point. While this method does try to enumerate more than one cube in every SAT enumeration, its drawback is that it is based on BDDs, and therefore not scalable or robust.

In still another approach of SAT-based UMC, interpolants are derived from the refutation generated by a SAT solver on unsatisfiable instances, instead of SAT-based quantifier elimination. See K. McMillan, "Interpolation and SAT-based Model Checking," in Computer-Aided Verification, pp. 1-13 (2003). However, the approach computes only approximate reachable states while it would be preferable to compute exact reachable states.

SUMMARY OF THE INVENTION

We have invented an efficient approach for SAT-based quantifier elimination that significantly improves the performance of pre-image and fix-point computation in SAT-based unbounded symbolic model checking (UMC). Our inventive method—in sharp contrast to the prior art—captures a larger set of states per SAT-based enumeration step during quantifier elimination. In addition, our invention advantageously uses circuit-based cofactoring to capture a large set of states and also uses a functional hashing based simplified circuit graph to represent the captured states.

In accordance with another aspect of our invention, a number of heuristics with small modifications to SAT procedure are disclosed to further enlarge the state set represented per enumeration, thereby reducing the enumeration steps.

Advantageously, our invention can be readily implemented in a SAT-based UMC framework, where we use it to compute pre-images across unrolled designs. Additionally, SAT-based existential quantification can be used effectively on a number of large industrial designs that were hard to model check using prior art purely BDD-based techniques. Finally, our invention can enable several orders of improvement in time and space over CNF-based approach.

These and other advantages of the invention will be apparent to those of ordinary skill in the art by reference to the following detailed description and the accompanying drawings.

BRIEF DESCRIPTION OF THE DRAWING

FIG. 2 illustrates a DPLL style SAT solver;

FIG. 3 illustrates SAT-based existential quantification;

FIG. 4 illustrates fix-point computation for EF(f);

FIG. 5 illustrates SAT-based BMC with induction proof;

FIG. 6 illustrates heuristics to enlarge captured state cubes using SAT-based quantification FIG. 7 illustrates SAT-based existential quantification, in accordance with an embodiment of another aspect of the invention;

FIG. 8 illustrates modified fix-point computation for EF, in accordance with an embodiment of another aspect of the invention;

DETAILED DESCRIPTION

Figure 1:
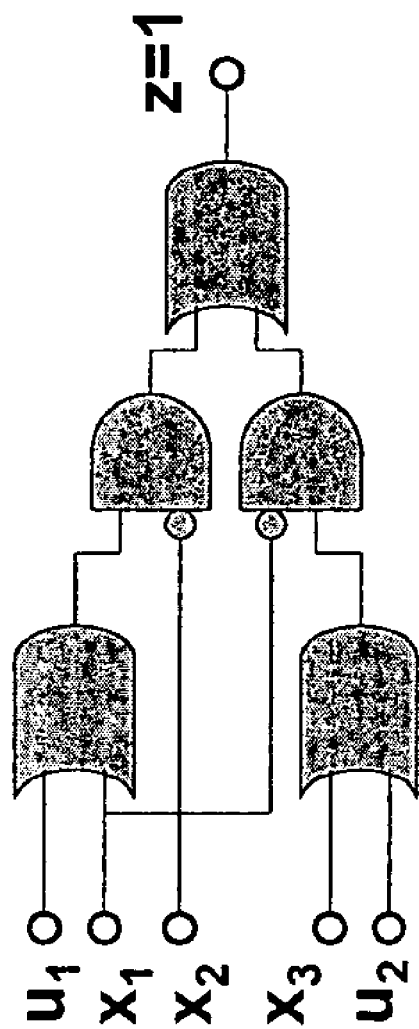
FIG. 1 shows an example circuit that provides a motivating example for our invention.

With reference now to FIG. 1, there is shown an example circuit that provides a motivating example for the present invention. In particular, we let the output node z represent the function $f=x_1'(x_3+u_2)+x_2'(x_1+u_1)$ where $u_1$, and $u_2$ are primary input variables and $x_1$, $x_2$, and $x_3$ are state variables. (Note, x' represents the complement of x). Our task is to compute $\exists u_1 u_2\ f(=x_1'+x_2')$ using SAT-based quantifier elimination.

As can be appreciated, this involves enumerating all the ways in which f evaluates to 1 in terms of the variables $x_1$, $x_2$ and $x_3$, for each combination of the variables $u_1$ and $u_2$. To avoid enumerating the same solution again, we need to add a constraint that excludes the solution obtained at a previous enumeration.

Continuing, suppose in the first enumeration, we get a satisfying partial assignment $\{u_1=1, x_2=0\}$. Note that previous approaches would add the blocking constraint $\Omega=x_2$ as an additional clause to f. As a result, the solution $x_2=0$ will never be enumerated again. In the next enumeration, let us say the solver produces a satisfying assignment $\{x_1=0, x_2=1, u2=1\}$. With the new solution cube $x_1'x_2$, the updated blocking constraint becomes $\Omega=x_2(x_1+x_2')=x_2 x_1$. With the addition of this constraint, we find no more solution and the procedure stops. Clearly, the negation of the blocking constraint $\Omega'$ represents the desired $\exists u_1 u_2\ f$.

The issues of enumeration time and representation size in the cube-wise approaches are addressed by our invention in the following way:

1. More than one solution cube per enumeration are captured, reducing the number of enumerations significantly.
2. An efficient circuit representation is used to capture the state sets. Detection and reuse of functional isomorphic structure significantly mitigates the space-out problem inherent in the previous approaches. For this example it can be shown that the present technique can discover the blocking constraint $\Omega=x_2 x_1$ in one enumeration step.

Preliminaries: Let V be a finite set of n variables over the set of Boolean values $B \in \{0,1\}$. A literal is a variable $v \in V$ or $v' \in V$. A cube is a product of one or more distinct literals. A minterm over a set of m variables is a product of m distinct literals in the set. A clause c is a disjunction of one or more distinct literals and is identified as a set of literals. In the sequel, clause and cube will be used interchangeably to represent the same set of literals. A cube, minterm, and clause are considered trivial if they have both v and v'. In the sequel, we use cube, minterm and clause to mean non-trivial. A CNF formula is a conjunction of clauses and is identified as a set of clauses.

A Boolean function is a mapping between Boolean spaces f: $B^n \to B$. Let $f(v_1 \ldots v_n)$ be a Boolean function of n variables. We use supp(f) to denote the support set $\{v_1 \ldots v_n\}$ of f. The positive and negative cofactor of $f(v_1 \ldots v \ldots v_n)$ with respect to variable v is $f_v=f(v_1 \ldots 1 \ldots v_n)$ and $f_{v'}=f(v_1 \ldots 0 \ldots v_n)$ respectively. Existential quantification of $f(v_1 \ldots v \ldots, v_n)$ with respect to variable v is $\exists v\ f=f_v+f_{v'}$. In the sequel, we will use function to represent a Boolean function. The cofactor $f_c$ of f by a cube c is obtained by applying a sequence of positive (negative) cofactoring on f with respect to variable v (v') in c. A function is a sum of product of minterms over its support variables and is identified with a set of minterms. Onset of a function f is a set of minterms $m_i$ such that $f(m_i)=1$. A sum and product of functions over the same domain can be viewed as the union ($\cup$) and intersection ($\cap$) of their onsets respectively. A function f is said to imply ($\Rightarrow$) another function g, if onset of f is subset ($\subseteq$) of onset of g. In the sequel we simply use $f \subseteq g$ to denote that f implies g.

A finite state machine is defined as 6-tuple $<I,O,S,\delta,\lambda,S^0>$ were I is the finite set of inputs, O is the set of outputs, S is the finite set of states, $\delta$: $S \times I \to S$ is the next state function, $\lambda$: $S \times I \to O$ is the output function, $S^0 \subseteq S$ is the set of initial states. Let $U=\{u_1 \ldots u_k\}$ denote the set of input variables and $X=\{x_1 \ldots x_m\}$ denote the set of state variables, where $U \cup X=V$ and $U \cap X=\emptyset$. In the sequel, we denote a latch (state holding element) with a state variable. A state $s \in S$ is a minterm over X. A state cube (and state clause) consists of only state variables. A characteristic function $\Omega_Q$: $X^m \to B$ represents a set of states $Q(\subseteq S)$, i.e., $Q=\{s|\Omega_Q(s)=1 \hat{} s \in S\}$.

An assignment is a function $\alpha: V_\alpha \to B$ where $V_\alpha(=\text{dom}(\alpha)) \subseteq V$. An assignment $\alpha_T$ is called total when $V_\alpha = V$; otherwise, called partial. An assignment $\alpha$ is satisfying for a formula f when f evaluates to 1 after applying $v = \alpha(v)$ for all $v \in V_\alpha$. We equate an assignment $\alpha$ with a cube that contains all v such that $\alpha(v)=1$ and all v' such that $\alpha(v)=0$. We extend the domain of $\alpha$ to literals, i.e., by $\alpha(v')=1$ we mean $\alpha(v)=0$. A satisfying state cube is $\alpha \downarrow X$ (projection of $\alpha$ onto state variables) and a satisfying input cube is $\alpha \downarrow U$ (projection of $\alpha$ onto input variables).

The Boolean Satisfiability (SAT) problem consists of determining a satisfying assignment for a Boolean formula on the constituent Boolean variables or proving that no such assignment exists. The problem is known to be NP-complete. Most prior art SAT solvers employ a DPLL style algorithm such as that shown in FIG. 2. As can be readily appreciated by those skilled in the art, such an algorithm includes three main engines namely, decision, deduction, and diagnosis. (See, for example, M. Davis, G. Longeman, and D. Loveland, "A Machine Program for Theorem Proving," Communications of the ACM, Vol. 5, pp. 394-97 (1962); J. P. Marques-Silva and K. A. Sakallah, "GRASP: A search algorithm for prepositional satisfiability," IEEE Transactions on Computers, 48:506-21 (1999); H. Zhang, "SATO: an efficient propositional prover," in Proceedings of International Conference on Automated Deduction, Vol. 1249, LNAI, pp. 272-75 (1997); and M. Moskewicz, C. Madigan, Y. Zhao, L. Zhang, and S. Malik, "Chaff: Enginnering an efficient SAT solver," in Design Automation Conference (2001)).

As can be appreciated, a Boolean problem can be expressed either in CNF or logical gate form or both. A hybrid SAT solver, (see, for example, M. Ganai, P. Ashar, A. Gupta, L. Zhang and S. Malik, "Combining strengths of circuit-based and CNF-based algorithms for a high-performance SAT solver", in Proceedings of Design Automation Conference (2002)), where the problem is represented as both logical gates and a CNF expression, is well suited for UMC as we will show.

A SAT-based existential quantification method enumerates all solutions through a series of SAT calls and by adding blocking constraints that exclude all the previously enumerated solutions. Turning our attention now to FIG. 3, there is shown a basic algorithm for SAT-based existential quantification based on cube enumeration that makes use of a number of individual procedures.

In particular, the procedure, SAT-EQ, takes a function f(A,B) with support variables from sets A and B and returns $C = \exists B f(A,B)$ after eliminating the variables from the set B by existential quantification. The procedure SAT_Solve is called repeatedly in line 3 on the constrained problem $f=1\hat{}C=0$ where C represents the set of enumerated solutions so far. The enumerated cube c, in line 5, is obtained by only keeping the A set literals from the assignment cube $\alpha$ in line 4. Successive enumeration of cube c stops in line 7 when C represents $\exists B f(A,B)$ exactly. The blocking constraints are represented by BDDs, zBDDs or by CNF. Enlarging the cube c is done by redrawing the implication graph or by applying a justification procedure as a post-processing step.

Now, a standard pre-image computation is given by $$\text{Pre-Image}(X) = \exists U, Y \delta(X,Y,U) \hat{} T(Y) \qquad (1)$$

where X, Y, and U represent the set of current, next state, and primary input variables respectively; T(Y) represents the set of input states and $\delta(X,Y,U)$ represents the transition relation. Note that when the procedure SAT-EQ in FIG. 3 is called with $f \leftarrow \delta(X,Y,U) \hat{} T(Y)$, $A \leftarrow X$, and $B \leftarrow U \cup Y$, it returns the pre-image of the set T(Y).

Turning our attention now to FIG. 4, there is shown a standard least point computation for CTL operator EF using the procedure SAT-EQ. R(X) is the set of states that satisfy EF(f(X)) and is updated with pre-images in line 4. Note that the exclusion of R(X) in the pre-image computation using SAT-EQ as shown in line 6 is equivalent to a typical saturation check of R(X). Moreover, one can use a reachability constraint (over-approximated reachable states from initial state), as a care set in line 6 to potentially get a fix point in lower number of pre-image steps than required by the backward diameter.

FIG. 5 shows SAT-based BMC augmented with the induction-based proof mechanism for verification of safety properties. In particular, for a given safety property P, a bound k, inductive invariant I, the procedure iBMC uses SAT_Solve to find a witness or a proof for the property P within the bound k. $P^i$, the property node at $i^{th}$ unrolling of transition frame is generated in line 5. The procedure SAT_Solve is invoked in line 6 to check if there exists a loop-free path (of length i) where the property is true in all the states except the last state. A correctness proof is returned if the check fails; otherwise, a SAT call is used to check if there exists a path from an initial state s to a state where the property fails. A counter-example CE is returned if the check succeeds. Otherwise, the design is unrolled to try induction at a greater depth. Note that we do not need the constraints C in line 7, but they can be used to speed the search for a counter-example. Similarly, one can use a reachability constraint as an inductive invariant I to generate the proof with fewer unrollings than required by the longest loop-free path.

In accordance with an embodiment of an aspect of the invention, an efficient approach is set forth for SAT-based quantifier elimination that dramatically reduces the number of required enumeration steps, thereby, significantly improving the performance of pre-image and fix-point computation in SAT-based unbounded symbolic model checking (UMC). It is believed to satisfy the requirement of doing much better than the cube-wise enumeration of previous methods in a SAT-based framework, using a state representation that is compact yet easy to reason with. The embodiment uses a circuit graph representation exploiting functional hashing schemes to represent the state sets as compared to Binary Decision Diagrams (BDDs), zBDD, and conjunctive normal form (CNF) representations. The present invention advantageously uses circuit-based cofactoring to capture a large set of states in each SAT enumeration step, and also uses circuit graph simplification based on functional hashing to represent the captured states in a compact manner. Given that the state set captured in our approach is guaranteed to contain the set of states captured in each enumeration step by the cube-based approaches, the present approach is also guaranteed to require a smaller number of enumeration steps. Moreover, as compared to other SAT-based UMC algorithms, the present approach does not require a redrawing of the implication graph or enlarging the enumerated cube as a post SAT procedure even though it captures a larger set of states per enumeration step.

As shown by the inventors it is advantageous to use a hybrid SAT-solver that works seamlessly on the circuit representation. (See, for example, M. K. Ganai, L. Zhang, P. Ashar, and A. Gupta, "Combining strength of circuit-based and CNF-based algorithms for a high performance SAT solver," in Design Automation Conference (2002).) The techniques described herein can be readily implemented in a SAT-based UMC framework where the effectiveness of SAT-based existential quantification can be shown on a number of large industrial designs that were hard to model check using other mechanisms. Several orders of improvement in time and space can be shown using the present approach over the best CNF-based approaches. The effectiveness of the several heuristics proposed herein can be demonstrated. Also, it is possible to use the present approach to prove the correctness of a safety property in an industrial design that could not be proved using any previous approach.

Advantageously, our inventive approach provides a number of distinct advantages over the prior art, namely: (a) our approach allows the capturing of more solution states than with the solution cube in a one SAT enumeration step; (b) A circuit-based characteristic function is used for efficiently representing states; (c) A hybrid SAT-solver can be used that makes previous approaches to enlarge the enumerated state cube using CNF-solvers and PODEM-based ATPG solvers redundant; (d) Several heuristics are proposed that can further enlarge the state set captured; and (e) A superior SAT-based quantifier elimination algorithm and a SAT-based UMC algorithm utilizing unrolled designs are proposed.

Consider the example in FIG. 1 where the first satisfying assignment is $\{u_1=1, x_2=0\}$. We can make the following two observations: (i) If all the unassigned inputs ($u_2$ in this example) were given some assignment (say, $u_2=1$), the resulting assignment would still be satisfying. (ii) The blocking constraint ($\Omega=x_2$ in this example), i.e., the negation of the enumerated cube, would remain unchanged even after step i is applied. Based on these two observations, a theorem can be presented that forms the basis of our SAT-based quantifier elimination strategy.

First we present a well known basic lemma.

Lemma: For a cube c and function f, $c \subseteq f \Leftrightarrow f_c=1$.

Proof: ($\Rightarrow$) Given $f_c=1$. As $cf_c \subseteq f$, clearly $c \subseteq f$.

($\Leftarrow$) Given $c \subseteq f$. Assume $f_c \neq 1$, i.e., there exists a minterm u over supp($f_c$) set such that $f_c(u)=0$. Note, u is independent of the literals of c. Now we construct a minterm m=uc. Clearly, m∈f. However, as c(m)=1 and $f_c(u)=0$, $f(m)=cf_c+c'f_c=0$, i.e., m∉f, a contradiction. Therefore, $f_c=1$.

Given a set of input variables U and a set of state variables X, we say assignment $\alpha: V_\alpha \to B$ for a function f is total with respect to the input set if $U \subseteq V_\alpha$. For such an assignment we call the satisfying input cube an input minterm. Note that by assigning an arbitrary Boolean value on all unassigned input variables $u \in U \setminus V_\alpha$, we can make the satisfying assignment total with respect to the input set.

Theorem 1: For a given satisfying assignment for f, let s be a satisfying state cube, u be satisfying input cube. If m∈u, then $s \subseteq f_m$, i.e. $f_m$ captures more minterms from the solution space than s.

Proof: As the cube ms (concatenation of m and s) is a satisfying cube, i.e., $ms \subseteq f$, using the above lemma, we get $f_{ms}=1$. Again, using the lemma $f_{ms}=1 \Rightarrow s \subseteq f_m$, we get the proof.

Based on the above theorem, it is possible using the following three steps to capture a larger set of satisfying states from a given satisfying assignment compared to the set of satisfying states derived from a satisfying state cube.

i. Pick a satisfying input minterm by choosing an assignment on the unassigned input variables in the satisfying assignment.

ii. Cofactor the function f with respect to the satisfying input minterm obtained in step I iii. Use the function obtain in step ii to represent the set of satisfying states.

It can be observed that the total number of iterations required depends, though less severely, on the choice of values imposed on the unassigned input variables in the satisfying assignment.

Following the above three steps, we can show that we can get a larger set of satisfying states than the satisfying cube $x_2'$ for the example in FIG. 1. We first make the assignment total with respect to input set by choosing $u_2=1$. When we cofactor $f=x_1'(x_3+u_2)+x_2'(x_1+u_1)$ with respect to a satisfying input minterm $m=u_1u_2$, we get $f_m=x_1'+x_2'$. Clearly, $f_m$ represents a larger set than the satisfying cube. Importantly, we required just one enumeration to capture the entire solution set. Though, in general, we may require more than one enumeration, we observed in our experiments that the number of iterations required is several orders of magnitude less compared to cube enumeration.

We observed that the total number of iterations required depends, though less severely, on the choice of values imposed on the unassigned input variables in the satisfying assignment. For example, if we had chosen $u_2=0$, then with input minterm $m=u_1u_2'$, we would get $f_m=x_1'x_3+x_2'$. Though, $f_m$ represents more states than the satisfying cube, we will require one more enumeration to capture all the satisfying states.

Before we discuss the various heuristics to pick a value for the unassigned input variables that increases the set of satisfying states captured, we present the following theorem. We show that even if we enlarge the satisfying assignment cube, and hence the state cube, the state set captured by the above steps i-iii remains a superset of the states represented by the enlarged state cube. This demonstrates that our approach is inherently superior to cube enlargement.

Theorem 2: Let there be two satisfying assignments $\alpha: V_\alpha \to B$ and $\beta: V_\beta \to B$ such that $V_\beta \subseteq V_\alpha$ and $\forall v \in V_\beta \beta(v)=\alpha(v)$. We denote $s_\alpha$ and $s_\beta$ as the satisfying state cubes and $u_\alpha$ and $u_\beta$ as the satisfying input cubes for the assignments $\alpha$ and $\beta$ respectively. If input minterm $m \in u_\alpha$, then $s_\beta \subseteq f_m$.

Proof: As $V_\beta \subseteq V_\alpha$, clearly $u_\alpha \subseteq u_\beta$ and $s_\alpha \subseteq s_\beta$. As $m \in u_\alpha$, $m \in u_\beta$. Using theorem 1, we get $s_\beta \subseteq f_m$.

One can, therefore, argue using the above theorem that the approaches to enlarge a state cube by redrawing implication graph or by identifying a necessary assignment on state variables are redundant when the states are captured as shown in steps i-iii. In the following, the present method of efficient representation of the state set and use of a hybrid-SAT solver that has clear advantage over a CNF-solver are discussed.

Circuit-based Characteristic Function. We use a 2-input OR/INVERTER graph representation for a Boolean function with inversion on the edges. We use an on-the-fly compression technique that uses a multi-level functional hashing scheme to detect and reuse structural and local functional redundancies during problem construction. (See, for example, M. K. Ganai and A. Kuehlmann, "On the-fly-compression of logical circuits," in International Workshop on Logic Synthesis (2000)) Using a two-level lookup scheme, any local four-input sub-structure is mapped to a canonical representation, effectively removing any local redundancy. We use this simplified circuit representation for representing the state transition relation and also for representing the set of enumerated states. A circuit-based characteristic function, unlike a BDD, is non-canonical and is less sensitive to the order in which it is built.

However, all operations cannot be done efficiently. For example, circuit-based existential quantification used in the prior art is highly inefficient due to an exponential increase in formula size. Existential quantification $\exists_B f(A,B)$ is the disjunction of formulas obtained by cofactoring f with all minterms over variables in B. [10, 16] perform this disjunction explicitly for each of the variables in B, leading to an exponential increase in formula size.

We, on the other hand, in our circuit-based cofactoring approach, use a SAT solver to identify a small number of satisfying assignments to f(A, B), propagate the B values through the circuit graph making it much simpler, and add this simplified circuit graph to the representation of the existential quantification. Key points here are that each addition to the representation of the quantification is a very simple circuit graph, and the number of such additions is limited by the pruning of the solution space in the SAT solver. Note that each circuit graph added is also used by the SAT solver to prune its search. As a result, the larger the number of minterms in an added circuit graph, the smaller the number of future SAT-based enumeration steps, and the smaller the number of times a circuit graph needs to be added in the future. In addition to keeping the size of the representation manageable, this approach also has a side benefit since, as a general rule, Boolean reasoning on a reduced and simplified formula leads to faster SAT search as compared to the unreduced formula. A simpler representation of the state set leads to efficiencies in its use down the line.

As mentioned above, we use a hybrid SAT solver that operates on a hybrid representation of Boolean constraints consisting of 2-input OR/INVERTER gates to represent the original circuit problem and CNF to represent the learned constraints. Using this hybrid solver, we do not have to convert a circuit problem to a CNF problem, saving both time and memory.

The hybrid solver allows the use of circuit-based decision heuristics, for example, a justification frontier to identify a partial satisfying assignment that is highly desirable for generating a large satisfying cube. Using this heuristic, a SAT solver can declare a partial assignment as satisfying when there are no more frontiers to justify, generally much earlier than the stopping criteria used in a CNF-based SAT solver. (See, for example, H. Fujiwara and T. Shimono, "On the Acceleration of Test Generation Algorithms," IEEE Transactions on Computers, Vol. C-32, pp. 265-72 (1983).) The use of circuit-based justification within the SAT-solver is preferred in comparison to the use of post processing methods after every SAT result that involve either a call to separate justification procedure or redrawing of the implication graph. It is also preferred to the use of dynamic detection and removal of inactive clauses before every new decision in a CNF-based SAT solver.

Heuristics for Enlarging the Satisfying State Set. The choice of values for the unassigned inputs to make a satisfying assignment total with respect to the input variable set have some impact on the formula size and the size of the representation of satisfying states. We present some heuristics for this purpose. These heuristics pick values on the unassigned input variables so that the resulting circuit graph has fewer latch variables in its support.

In the sequel, we use circuit to refer to a 2-input OR/INVERTER graph and node to refer an OR gate, a primary input or a latch. The two immediate fanins of an OR gate will be referred to as the left and right children. They can be an inverted or non-inverted node. Here are some more definitions we will use:

Definition 1: A support variable of a node is a primary input or latch in the transitive fanin cone of the node.

Definition 2: A latch frontier is node that has only latches in its support, and at least one of its fanouts has one or more primary input variables in the support. In other words, the other child of the fanout node has at least one primary input variable in the support.

Definition 3: A justification-frontier node is a node that can justify the value 1 on the immediate fanout node. Note that when a node has value 1, then potentially the left or/and right children can be justification-frontiers by taking value 1. A SAT-solver, typically, selects one of the justification frontiers as a future decision variable. For a satisfying assignment, the selected justification-frontier variable is required to have an assignment.

Definition 4: A positive (negative) fanout score of node is the number of its fanouts where the node appears as a non-inverted (inverted) child. The higher of the positive or negative fanout scores of a node is referred to as the score of a node.

Heuristic 1 (H1): Given a satisfying assignment $\alpha: V_\alpha \to B$ and satisfying input cube u, we choose a satisfying input minterm m=uw where literals in w are chosen based on the score of corresponding variable. If the positive (negative) score of the primary input variable is more than the negative (positive) score, we chose positive (negative) literal. The basic idea is that the controlling value of primary input variable can provide an alternate path for justification that was previously performed through assignments on the state variables.

Heuristic 2 (H2): Our SAT-solver terminates with a satisfying assignment when there is no remaining justification-frontier. In this heuristic, we use the SAT solver to find further assignments on the unassigned primary input variables even after the first satisfying assignment has been found. With reference now to FIG. 6, one can observe that once the first satisfying assignment is obtained, we use the procedure Get_More_Frontiers in FIG. 6 to traverse the graph from the objective towards the inputs and collect unassigned nodes (in lines 12 and 19) that are potentially justification-frontiers. These nodes are then added to SAT solver as additional justification-frontiers. The SAT solver, then, resumes the process of finding a satisfying assignment that includes more input variables. This procedure is called repeatedly after every satisfying assignment until there are no more additional frontiers to add. Note that this heuristic does not change the SAT justification frontier heuristic based on its score. Therefore, it does not affect the SAT time for getting the first satisfying assignment. The subsequent satisfying assignments are much easier to find, as the problem size gets smaller at each step.

Heuristic 3 (H3): This heuristic is similar to heuristic 2 with a difference that the procedure Get_More_Frontiers is called only once. The unassigned input variables then are assigned based on Heuristic 1.

Heuristic 4 (H4): Like Heuristic 2, this heuristic invokes the procedure Get_More_Frontiers with the difference that the frontiers added to F are not latch frontiers as shown in lines 14 and 21. Since latch frontiers, by definition, do not have input variables in the support, any assignment to justify them will not increase the number of assigned input variables. This heuristic, unlike Heuristic 2, reduces the subsequent justification problem size even further.

Heuristic 5 (H5): This heuristic is similar to Heuristic 4 with the difference that the procedure Get_More_Frontiers is called only once. The unassigned input variables are assigned based on Heuristic 1.

Importantly, Heuristics 1-5 do not change the SAT solver decision heuristics. On the other hand, the following two heuristics do change the decision heuristics.

Heuristic 6 (H6): As noted earlier, the SAT decision heuristic for choosing the justification frontier is typically based on node score. If the left child of the node to justify has higher score than the right child, the left child is selected for making future decisions. In Heuristic 6, both the left and right children are chosen as justification frontiers for making decisions. Our SAT solver generates a new frontier node only if it makes a decision on a node that is not a latch or primary input. If a frontier node gets an assignment through implication, then no new frontier node is generated. Therefore, this heuristic may not lead to a total assignment. We, then, use Heuristic 1, to assign the remaining unassigned input variables.

Heuristic 7 (H6): This heuristic is similar to Heuristic 6 except that both left and right children are not always selected as frontier nodes. When one of them is a latch frontier and has a lower score, only the other frontier is selected. The intuition, similar to Heuristic 4, is that assignment on latch frontier nodes does not increase the number of assigned input variables.

SAT-based Existential Quantification. FIG. 7 presents the improved SAT-based existential quantification procedure, mSAT-EQ. The procedure is similar to SAT-EQ with modifications to lines 5 and 6. In line 5, we obtain a satisfying input minterm m over the B variables from the recently found satisfying assignment using one of the Heuristics 1-7 discussed above. The function f is cofactored with the input minterm using the circuit-based approach in line 6 to obtain a set of satisfying states that is a superset of the set of states obtained in line 5 in FIG. 3. Note that circuit-based cofactors obtained in line 6 are represented compactly using functional hashing scheme discussed above. Especially, the nodes that do not have support of B variables get reused.

FIG. 8 shows an embodiment of the fix-point algorithm, mFix_Point_EF for the EF property. It uses the mSAT-EQ algorithm for pre-image calculation. Note that, unlike the standard algorithm, where a pre-image calculated in the previous step is used to calculate the next pre-image, we use unrolled f' to represent the target states. Note that this change uses the unrolled design as an implicit representation of the intermediate states, at the potential expense of quantifying out a larger set of variables. However, it does not modify the overall fix-point algorithm. and gives better performance in practice. In our experience, we observed that the representation of f' is more compact than the representation for $(\delta^\wedge T(<X \leftarrow Y>)$.

Thus, SAT-based quantifier elimination is possible using a cofactor enumeration approach that captures a larger set of solution states per SAT satisfying assignment compared to a cube enumeration approach. The embodiments of the present invention require several orders of magnitude fewer enumerations compared to cube-wise enumeration. Moreover, using an efficient circuit representation for states and a hybrid SAT-solver, our circuit cofactoring approach is less dependent on variable ordering and scales well with design size and complexity. As discussed above, BDD-based model checking tools do not scale well with design complexity and size. SAT-based BMC tools provide faster counter-example checking, but proof requires unrolling of the transition relation up to the longest diameter. The present invention presents a viable improvement in that, unlike previous approaches to SAT-based unbounded model checking, it does not suffer from large time and space requirements for solution enumeration.

Figures 9A, 9B:
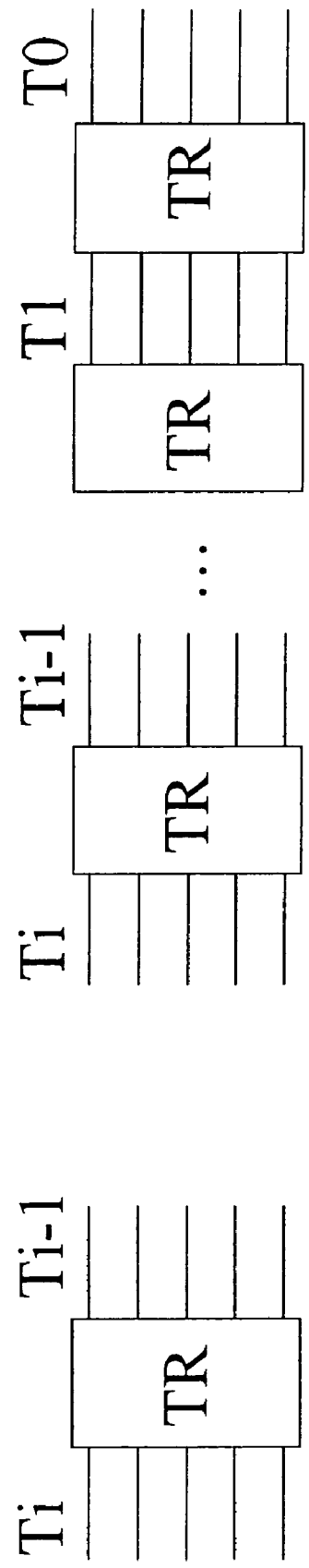
FIG. 9 is a simplified block diagram highlighting our inventive unrolling at each depth.

Turning now to FIG. 9, there is shown a simplified block diagram that serves to highlight a significant aspect of our present invention. More specifically, FIG. 9A shows a use of pre-image computation in prior art, where the state set $T_i$ is computed from the state set $T_{i-1}$ by quantification across a single transition frame.

Figure 10:
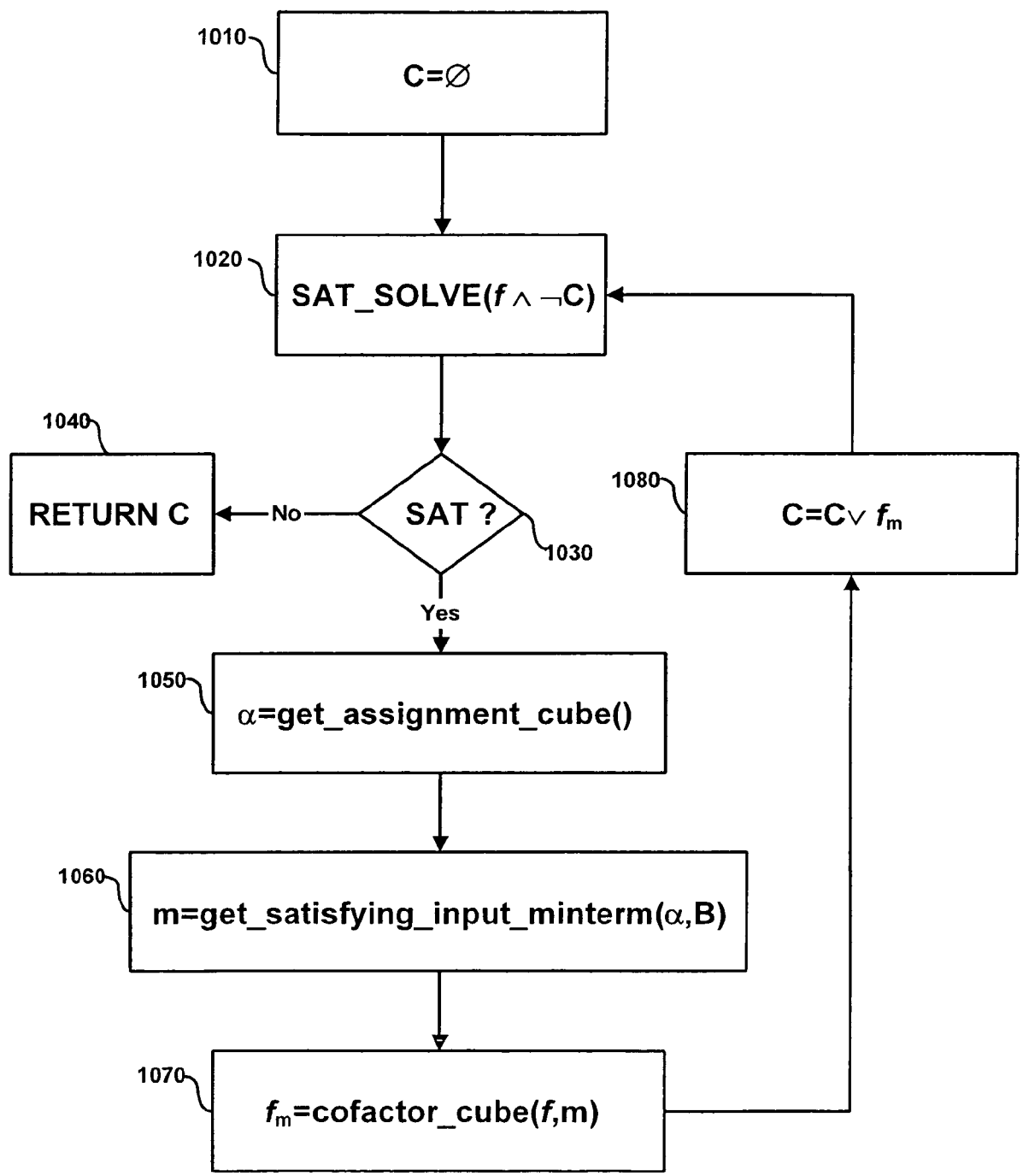
FIG. 10 is a flow chart illustrating our SAT-based existential quantification.

In sharp contrast, according to our inventive method and as depicted in FIG. 9B, for computing $T_i$, an unrolling of $T_1$, $T_2$, . . . up to $T_i$ takes place which advantageously provides a more compact, and efficient representation, while requiring quantification across multiple transition frames Turning now to FIG. 10, there is shown a flow chart which depicts our SAT-based existential quantification used in the present method. In particular, block 1010 involves the initialization of C, which then calls through block 1020 our SAT_SOLVE routine. If SAT is not met, then block 1040 Returns states satisfying the conditions. Alternatively, block 1050 gets satisfying assignment cube, followed by block 1060 which gets the satisfying input minterm, followed by block 1070, which cofactors f with the minterm. The set is updated for satisfying state at block 1080 and block 1020 is repeated as above.

Figure 11:
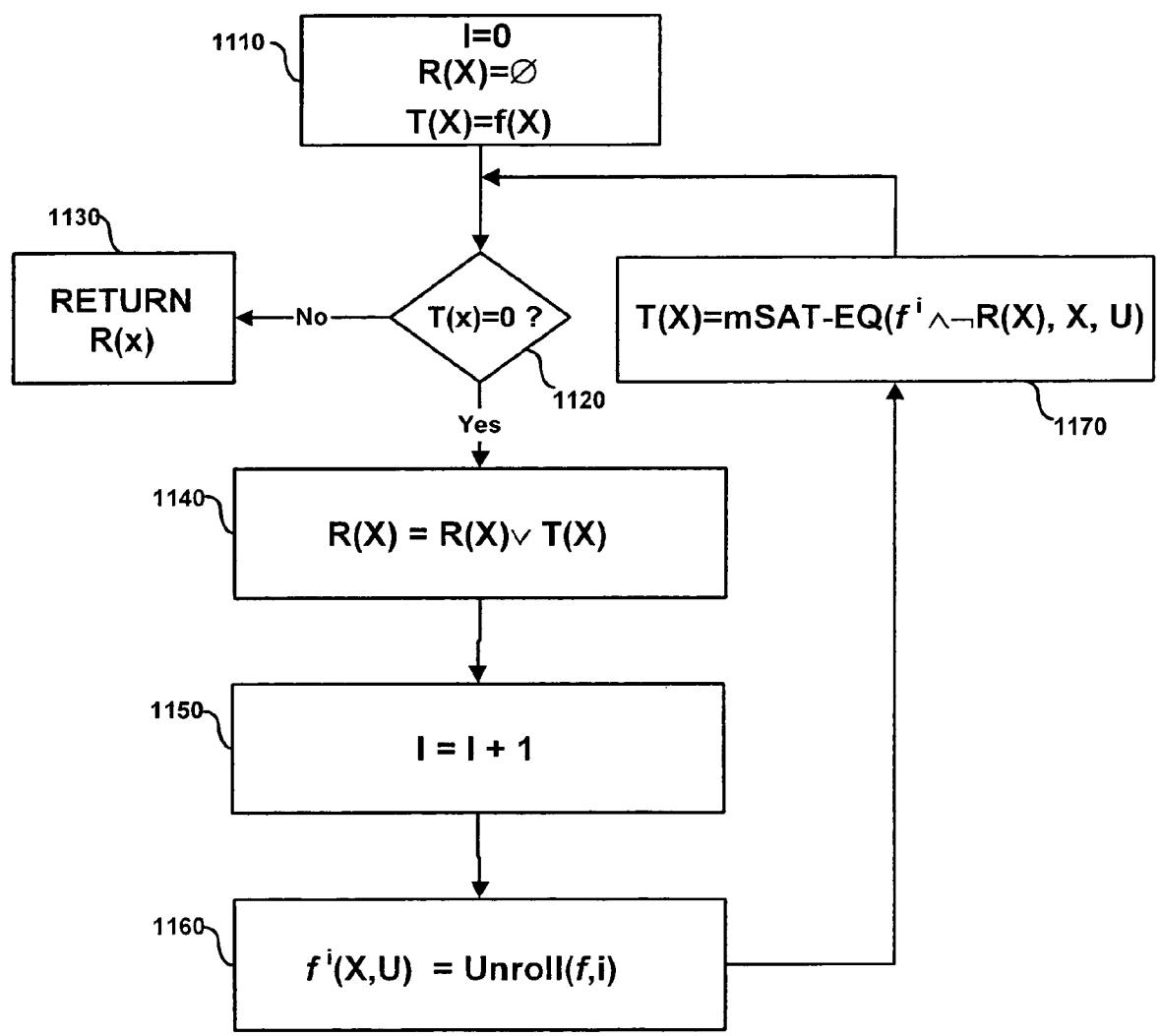
FIG. 11 is a flow chart illustrating our modified fix-point computation for EF, in accordance with an embodiment of another aspect of the invention.

FIG. 11 shows a flow chart depicting our modified Fix-Point computation, and the method begins by initializing at block 1110, then, at block 1120 checking to see if the pre-image "from" set is empty. If so, it is returned at block 1130, else at block 1140 we add the $i^{th}$ pre-image and update the backward reachable states, followed by an increase in the unroll step at block 1150, the unroll at block 1160 and finally computing the existential quantification at block 1170, which then returns to block 1120 to check to see if the pre-image is empty.

Figure 12:
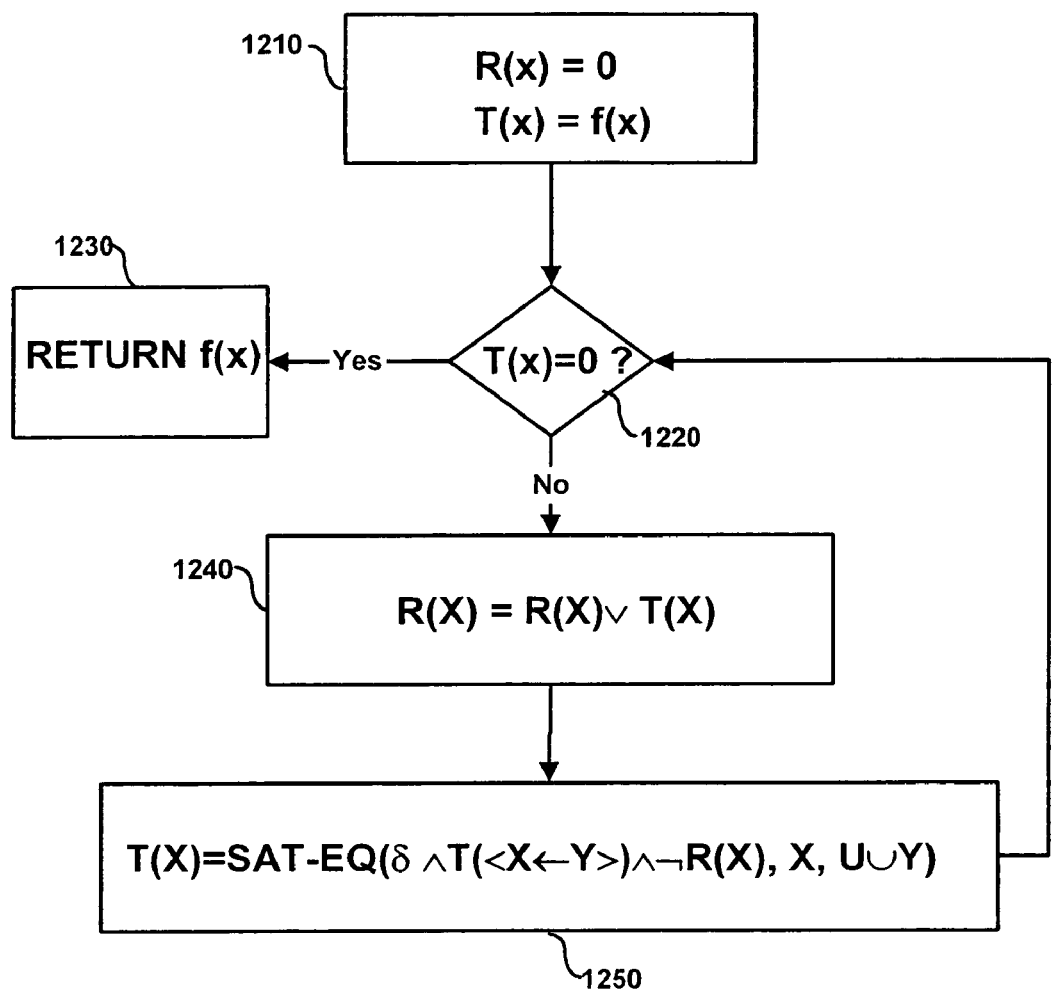
FIG. 12 is a flow chart illustrating at a high-level, the fix-point computation for EF.

Finally, we turn to FIG. 12 which shows in flow-chart form a high level view of our method. More specifically, after initialization at block 1210, a check is performed at block 1220 to determine whether the final point is reached. If so, the states satisfying the conditions are returned at block 1230, else in block 1240 R is updated and a new pre-image state is calculated in block 1250, from which another determination of final point is made at block 1220.

At this point, while we have discussed and described our invention using some specific examples, our teachings are not so limited. Accordingly, our invention should be only limited by the scope of the claims attached hereto.

What is claimed is:

1. A computer-implemented method of solving a SAT-based quantifier elimination problem, said method comprising the following steps:

enumerating, as a result of a series of calls to a SAT solver, satisfying solutions for a given Boolean formula;

cofactoring the given Boolean formula with a satisfying minterm over the variables to be quantified, in order to capture one or more satisfying states enumerated by the SAT solver, and to additionally capture some satisfying states that cannot be captured by a cube and that have not yet been enumerated by the SAT solver;

representing, a suitably efficient representation of the captured states; and generating, a computer-generated output of the suitably efficient representation.

2. The method of claim 1, wherein the quantification includes a BDD-based quantification.

3. The method of claim 1, wherein the captured set of satisfying states that have not yet been enumerated by the SAT solver is increasing.

4. The method of claim 1, wherein the captured set of satisfying states that have not yet been enumerated by the SAT solver is increasing, and the satisfying minterm is heuristically chosen.

5. The method of claim 1, wherein Boolean operations and state representations are represented by semi-canonical circuit representations.

6. The method of claim 1 wherein the enumeration step includes generating partial satisfying assignments through the use of a hybrid SAT solver.

7. A computer implemented method for computing backward reachable states iteratively, said method comprising the steps of:
a) unrolling a design, successively in a step-by-step manner;
b) calculating, a pre-image across multiple time frames in the unrolled design in each of the successive steps;
c) updating, a set of backward reachable states, starting from a given set of target states, in each of the successive steps; and
d) repeating, the steps a-c until a suitable termination criterion on the backward reachable states is obtained; and
e) generating, a computer-generated output of the suitably efficient representation;
wherein said calculating step further comprises the steps of:
enumerating, as a result of a series of calls to a SAT solver, satisfying solutions for a given Boolean formula;
cofactoring the given Boolean formula with a satisfying miniterm over the variables to be quantified, in order to capture one or more satisfying states enumerated by the SAT solver, and to additionally capture some satisfying states that cannot be captured by a cube and that have not been enumerated by the SAT solver; and
representing, a suitably efficient representation of the captured states.

8. The method of claim 7, wherein the quantification includes a BDD-based quantification.

9. The method of claim 7, wherein the captured set of satisfying states that have not yet been enumerated by the SAT solver is increasing.

10. The method of claim 7, wherein the captured set of satisfying states that have not yet been enumerated by the SAT solver is increasing, and the satisfying minterm is heuristically chosen.

11. The method of claim 7, wherein Boolean operations and state representations are represented by semi-canonical circuit representations.

12. The method of claim 7, wherein the enumeration step includes generating partial satisfying assignments through the use of a hybrid SAT solver.

13. The method according to claim 7 wherein the pre-image calculated is an approximate pre-image.

14. The method according to claim 7 further comprising the step of:
setting a threshold on the number of SAT enumerations.

15. The method of claim 7, wherein said pre-image computation step includes additional constraints to exclude previously-reached states.

16. The method of claim 7 wherein said state-set is represented by a circuit-graph representation.

17. The method according to claim 7 further comprising the step of:
additionally using an external invariant such that the termination condition is achieved in a smaller number of steps.

18. A computer implemented method for computing backward reachable states iteratively, said method comprising the steps of:
a) calculating, a pre-image across a single time frame of a design in each of the successive steps; said calculating step including:
enumerating, as a result of a series of calls to a SAT solver, satisfying solutions for a given Boolean formula;
cofactoring the given Boolean formula with a satisfying minterm over the variables to be quantified, in order to capture one or more satisfying states enumerated by the SAT solver, and to additionally capture some satisfying states that cannot be captured by a cube and that have not yet been enumerated by the SAT solver; and
representing, a suitably efficient representation of the captured states;
b) updating, a set of backward reachable states, starting from a given set of target states, in each of the successive steps; and
c) repeating, the steps a-b until a suitable termination criterion on the backward reachable states is obtained; and
d) generating, a computer-generated output of the captured states.

19. The method of claim 18, wherein the quantification includes a BDD-based quantification.

20. The method of claim 18, wherein the captured set of satisfying states that have not yet been enumerated by the SAT solver is increasing.

21. The method of claim 18, wherein the captured set of satisfying states that have not yet been enumerated by the SAT solver is increasing, and the satisfying minterm is heuristically chosen.

22. The method of claim 18, wherein Boolean operations and state representations are represented by semi-canonical circuit representations.

23. The method of claim 18 wherein the enumeration step includes generating partial satisfying assignments through the use of a hybrid SAT solver.

24. The method according to claim 18 wherein the pre-image calculated is an approximate pre-image.

25. The method according to claim 18 further comprising the step of: setting a threshold on the number of SAT enumerations.

26. The method of claim 18, wherein said pre-image computation step includes additional constraints to exclude previously-reached states.

27. The method of claim 18 wherein said state-set is represented by a circuit-graph representation.

28. The method according to claim 18 further comprising the step of:
additional use of an external invariant such that the termination condition is achieved in a smaller steps.

* * * * *